United States Patent [19]
Tera et al.

[11] Patent Number: 5,485,051
[45] Date of Patent: Jan. 16, 1996

[54] SURFACE ACOUSTIC WAVE DEVICE

[75] Inventors: Yoshiko Tera; Kouji Morishima; Atsushi Sakai, all of Hyogo, Japan

[73] Assignee: Mitsubishi Denki Kabushiki Kaisha, Tokyo, Japan

[21] Appl. No.: 241,995

[22] Filed: May 12, 1994

Related U.S. Application Data

[63] Continuation of Ser. No. 112,474, Aug. 27, 1993, Pat. No. 5,396,199.

[30] Foreign Application Priority Data

Sep. 2, 1992 [JP] Japan .................. 4-234535

[51] Int. Cl.$^6$ .................................................. H03H 9/145
[52] U.S. Cl. .................. 310/313 B; 310/313 D; 333/154; 333/193
[58] Field of Search ........................ 333/150, 154, 333/193; 310/313 R, 313 B, 313 C, 313 D

[56] References Cited

U.S. PATENT DOCUMENTS 4,973,875  11/1990  Yatsuda ................... 310/313 D

FOREIGN PATENT DOCUMENTS 48516    3/1983  Japan ....................... 333/193
1137718  5/1989  Japan ....................... 310/313 B

*Primary Examiner*—Benny Lee
*Attorney, Agent, or Firm*—Rothwell, Figg, Ernst & Kurz

[57] ABSTRACT

To obtain a surface acoustic wave device which can be produced with ease at a low cost and can be reduced in size without causing deterioration of characteristics, a surface acoustic wave device having input and output transducers arranged alternately on the surface of a substrate for propagating a surface acoustic wave includes metal patterns provided outside the transducers along the extension line of the propagation path of the surface acoustic wave and having at least one surface inclined at an angle $\theta$ ($5°<\theta<85°$ or $-85°<\theta<-5°$) with respect to the propagation direction of the surface acoustic wave.

1 Claim, 15 Drawing Sheets

SURFACE ACOUSTIC WAVE DEVICE

This is a division of application Ser. No. 08/112,474, filed Aug. 27, 1993, now U.S. Pat. No. 5,396,199, issued 7 Mar. 1995.

Background of the Invention

1. Field of the Invention

The present invention relates to a surface acoustic wave device, and, more specifically, to a surface acoustic wave device having low loss and few ripples in in-band frequency characteristics.

2. Description of the Prior Art

In the conventional method for making an excellent surface acoustic wave device having low loss and excellent out-band frequency characteristics, patterns made of a metal thin film are formed outside input and output transducers and grounded. Such a method is disclosed, for example, in CPM 81–20 of Vol. 81 No. 78 of *Denshi Buhin and Zairyo* (electronic parts and materials), a technical research report issued by the Institute of Electronics and Communication Engineers of Japan on Jul. 20, 1981. The configuration of this type of surface acoustic wave device will be described as a prior art corresponding to the first invention with reference to FIG. 3. FIG. 3 is a schematic diagram of this prior art comprising three electrodes, which was drawn with reference to a photograph included in the above-described document. In FIG. 3, the surface acoustic wave filter of this prior art is structured such that two input transducers 2 and one output transducer 3 are arranged alternately on a substrate 1 for propagating a surface acoustic wave along the propagating direction of the surface acoustic wave, the input transducers 2 are connected to an input terminal 4 while the output transducer 3 is connected to an output terminal 5, and metal patterns 6 which are grounded are arranged outside the input transducers 2. To describe the prior art briefly, the number of electrodes and the number of electrode fingers are reduced to explain the basic structure of the device and the role of the metal patterns 6 outside the transducers is the same as that of the prior art.

FIG. 5 is a schematic diagram of a surface acoustic wave device proposed, for example, in Utility Model Application No.2-28125. In the figure, reference numeral 1 represents a parallelogrammic substrate for propagating a surface acoustic wave. On the substrate, two input transducers 2 and one output transducer 3 are arranged alternately along the propagating direction of the surface acoustic wave and the input transducers 2 are connected to the input terminal 4 while the output transducer 3 is connected to the output terminal 5.

A description is subsequently liven of the operation of the above-described prior art.

Electric power of an input signal supplied to the input terminal 4 is divided and supplied to the two input transducers 2 which convert the electric power into a surface acoustic wave. The converted surface acoustic wave propagates toward both sides of the input transducers 2 as shown by the arrows of FIG. 3 or FIG 5. The output transducer 3 receives the surface acoustic wave and converts it into an electric signal. The converted electric signal is then output from the output terminal 5 as an output electric signal.

The surface acoustic wave propagating toward both end portions of the substrate 1 from the input transducers 2 is not received by the output transducer 3. Thereby, half of the total electric power being directed toward both ends of the substrate 1 for propagating the surface acoustic wave is discarded.

Generally speaking, when, at both end portions of the substrate 1 along the extension line of the propagation path of a surface acoustic wave, the surface acoustic wave leaked toward both end portions of the substrate 1 propagates from the input transducers constructed by metal patterns toward both end portions of the substrate 1 where the metal patterns do not exist, reflection is caused by mismatching of acoustic impedance due to the existence and non-existence of the metal patterns, leading to such deterioration of characteristics as ripples in amplitude characteristics and phase characteristics.

To overcome this problem, as shown in FIG. 3, metal patterns 6 are formed along the extension line of the propagation path of the surface acoustic wave. Then, mismatching of acoustic impedance is minimal or rarely occurs, thus causing little reflection, whereby the effect of reflection at both end portions of the substrate 1 of the surface acoustic wave leaked toward both end portions of the substrate 1 can be minimized.

Meanwhile, a surface acoustic wave device which makes use of irregular reflection at both end portions of the substrate 1 is shown in FIG. 5.

FIG. 27 is a plan view of a surface acoustic wave device of a prior art corresponding to the second invention as disclosed, for example, in Japanese Laid-Open Patent No.1-292908. FIG. 28 is also a plan view of a surface acoustic wave device provided with grating reflectors of another prior art as disclosed, for example, in Japanese Laid-Open Patent No. 62-12206. FIG. 29 is also a plan view of a surface acoustic wave device provided with a multi-strip coupler of another prior art as disclosed, for example, in Japanese Laid-Open Patent No. 62-31212.

A description is given of the construction of each of the above prior arts of FIGS. 27, 28, 29. Reference numeral 2 and 3 represent input and output inter-digital transducers (hereinafter abbreviated as IDT) for converting an electric signal into a surface acoustic wave or a surface acoustic wave into an electric signal, respectively. Reference numeral 7 represents grating reflectors for reflecting a surface acoustic wave as shown in FIG. 28, and 8 designates a multi-strip coupler (hereinafter abbreviated as MSC) as shown in FIG. 29. Components 2, 3, 7 and 8 are arranged on the surface of the substrate 1.

The input and output IDTs are constructed by electrode fingers 2a and 2b and electrode fingers 3a and 3b, respectively, whose comb portions mesh with each other. The grating reflectors and the MSC are constructed by a plurality of strip lines.

Electron beam lithography may be used for patterning of the surface acoustic wave devices of these prior arts. In the electron beam lithography, an electron beam is irradiated onto a photosensitive agent for exposure unlike photolithography in which a photomask pattern is transferred by light. This electron beam lithography is very effective especially for the formation of fine patterns because of the short wavelength of a radiation source.

Electron beam exposure is applied in the production of a photomask used in the patterning of the above-described photolithography. The pattern configuration of a photomask is exactly the same as that of a surface acoustic wave device.

However, since the prior art surface acoustic wave device corresponding to the first invention is structured as described above, in the configuration of FIG. 3, the surface acoustic wave leaked from end portions of the input transducers 2 is hardly reflected at the boundaries of the metal pattern 6 and the input transducer 2. However, when the surface acoustic wave propagates from an end portion of the metal pattern 6 toward an end portion of the substrate 1, it is reflected at an end portion of the metal pattern 6 due to mismatching of acoustic impedance caused by the existence and non-existence of the metal pattern. This is based on the fact that the effect of reflection of the surface acoustic wave propagating from the input transducers 2 at the boundaries of the metal pattern 6 and the input transducer 2 can be reduced by adjusting the space between the input transducer 2 and the metal pattern 6, whereas it is difficult to control the effect at the boundaries of the metal pattern 6 and an end portion of the substrate 1. A surface acoustic wave device having 13 input and output transducers arranged alternately on the surface of a 64° Y-rotation, X-propagation lithium niobate substrate like the above-described prior art was actually produced and it was found that the device was greatly affected by reflection, as shown in FIG. 4. The term, a 64° Y-rotation, X-propagation lithium niobate substrate used herein, refers to a substrate over the surface of which a surface acoustic wave propagates and the plate normal of the surface of which is inclined at an angle of more than 59° and less than 69° from the Y axis of the crystalline axis toward the Z axis, and wherein the propagation direction of the surface acoustic wave forms an angle of more than −5° and less than +5° or more than 175° and less than 185° with respect to the X axis of the crystalline axis. This substrate has good performance in propagating a surface acoustic wave.

FIGS. 4, 6, and 7 show frequency response characteristics in the pass band for prior art SAW filters. These are depicted in terms of loss as a function of frequency in the pass band. As shown on the vertical axis, loss decreases toward zero in the upward direction. The response of the prior art devices shows the presence of ripples in the frequency response characteristics in the pass band.

In of FIG. 4 t1 represents a feedthrough signal (direct wave), t2 is a main signal, t3 and t4 are reflections from the metal pattern 6 of FIG. 3, and t5 is a reflection from an end portion of the substrate 1. Frequency characteristics resulting from these signals are shown in FIG. 6. Frequency characteristics obtained from the configuration of FIG. 5 are shown in FIG. 7. A number of ripples, although small, remain in both frequency characteristics.

The configuration of the prior art device shown in FIG. 5 in which the substrate 1 becomes bulky is not suitable to reduce the size of the device.

The first invention is intended to solve the above problems and it is an object of the present invention to provide a surface acoustic wave device which has a simple structure that can be constructed by the same method as that used for input or output transducers, can prevent deterioration of frequency characteristics caused by reflections of a surface acoustic wave leaked from both ends of the transducers, and can be made small in size.

Since a conventional surface acoustic wave device corresponding to the second invention is structured as described above, in the case of patterning by means of the electron beam lithography, electrons irradiated from a radiation source onto a certain point of a photosensitive agent move in the agent and affect other parts of the photosensitive agent surrounding the point. As a result, photosensitive conditions may differ at each part of the agent and variations in line width called "proximity effect" may occur.

In other words, as shown in FIG. 30, root portions 2e and 3e of the electrode fingers may be thinner or partly broken, or, as shown in FIG. 31, the electrode fingers 2f and 3f at the uppermost end or having no patterns adjacent thereto may be thinner than other electrode fingers, or the width of the strip lines of the grating reflector and the MSC may be smaller than the width of other strip lines.

The photomask has similar problems.

SUMMARY OF THE INVENTION

The present invention is intended to solve the above-described problems, and it is an object of the invention to provide a surface acoustic wave device which can prevent improper patterning caused by the proximity effect.

According to the first invention, there is provided a surface acoustic wave device wherein metal patterns provided outside input or output transducers on the surface of the substrate for propagating a surface acoustic wave along the extension line of the propagation direction of the surface acoustic wave have an inclined side with respect to the propagation direction of the surface acoustic wave.

According to the second invention, there is provided a surface acoustic wave device wherein input and output IDTs have electrode fingers whose root portions are made wider than other portions where electrode fingers mesh with each other.

There is also provided a surface acoustic wave device wherein the electrode fingers of input and output IDTs having a much wider space between patterns are made wider than electrode fingers adjacent thereto.

The strip lines of grating reflectors and a multi-strip coupler having a much wider space between patterns may be made wider than strip lines adjacent thereto.

The width of a portion of the strip line of a multistrip coupler having a much wider space between patterns may be made larger than the width of other portions.

In the surface acoustic wave device according to the first invention, since the surface acoustic wave leaked from the transducer propagates without being reflected at the boundaries of the transducer and the metal pattern and is refracted by an impedance gap, it deviates from the propagation direction of the surface acoustic wave in the transducer. As a result, most of the wave leaked from both ends of the transducer does not return to the inside of the transducer and accordingly, the effect of reflection from end portions of the substrate is small, thereby eliminating deterioration of frequency characteristics.

The surface acoustic wave device according to the second invention can prevent improper patterning by making larger the width of a pattern which may be thinner or broken by the proximity effect of electrons which occurs at the time of electron beam exposure.

The above and other objects, features and advantages of the invention will become more apparent from the following description when taken in conjunction with the accompanying drawings.

BRIEF DESCRIPTION OF THE DRAWINGS

Identical reference numerals and labels used in the different drawing figures refer in each case to the same elements and therefore may not be described in detail for all drawing figures in which such identical reference numerals or labels are used.

Description of the Preferred Embodiment

Embodiment 1

Preferred embodiments of the first invention will be described hereunder with reference to FIG. 1 and FIG. 2(a) and (b).

Figure 1:
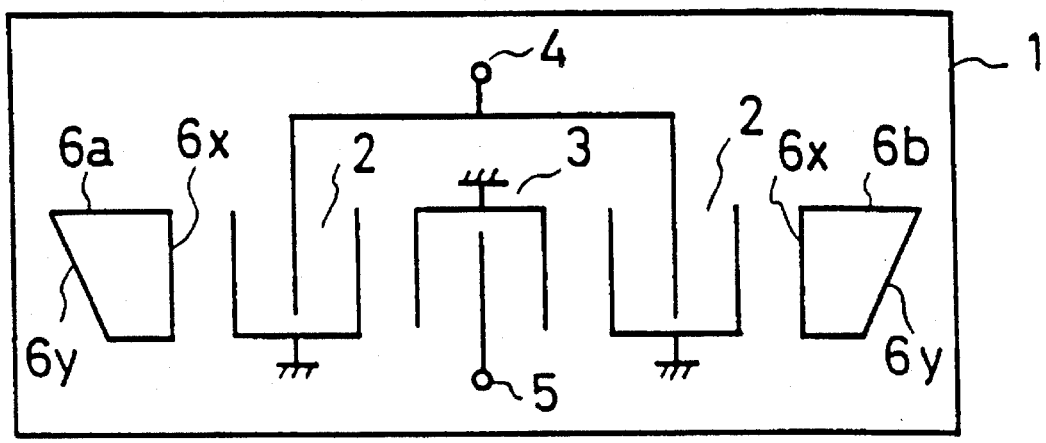
FIG. 1 is a block diagram of a surface acoustic wave device according to Embodiment 1 of the present invention.
Figure 2:
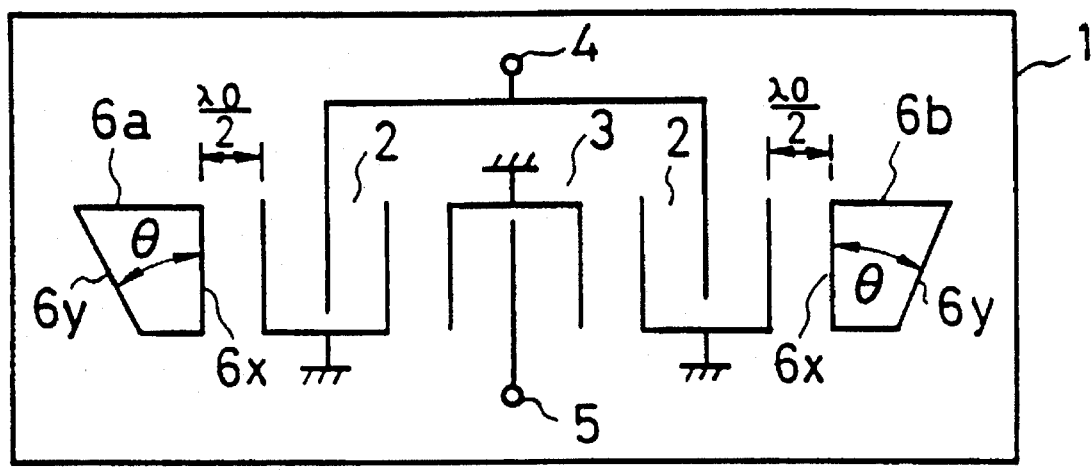
FIGS. 2(a) and 2(b) are a block diagram of another surface acoustic wave device according to Embodiment 1 of the present invention.
Figure 2B:
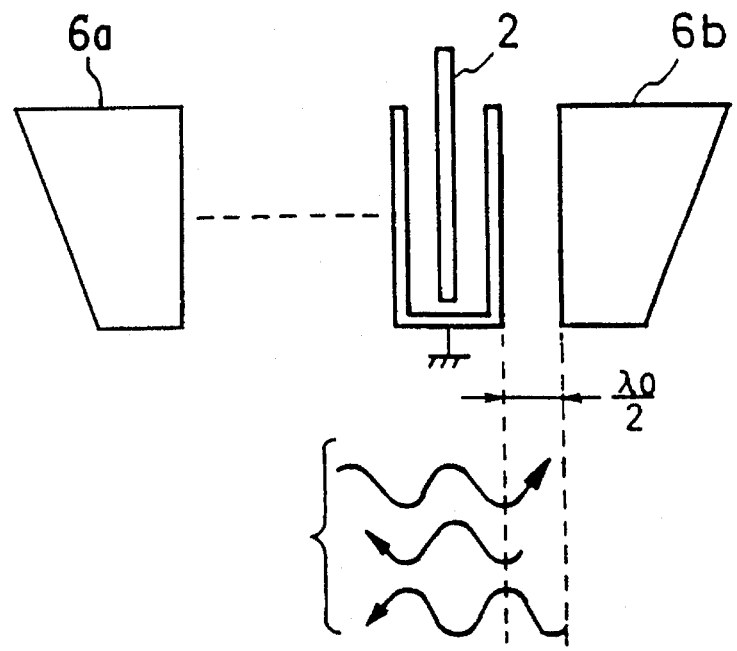

A surface acoustic wave device according to the preferred embodiment of the first invention is structured as shown in FIG. 1 and FIG. 2(a) in that two input transducers 2 and one output transducer 3 are arranged alternately along the propagation direction of a surface acoustic wave on a piezoelectric substrate 1, the input transducers 2 are connected to an input terminal 4 and the output transducer 3 to an output terminal 5, and metal patterns 6a and 6b made of a metal thin film are formed outside the input transducers 2. The metal thin film is formed by sputtering a metal such as Al, Au and Cu. As shown in FIG. 2(a), the metal patterns 6a and 6b are spaced half a wavelength from the input transducers 2. FIG. 2(b) is a schematic diagram of the phase of an incident wave and a reflected wave.

Figure 3:
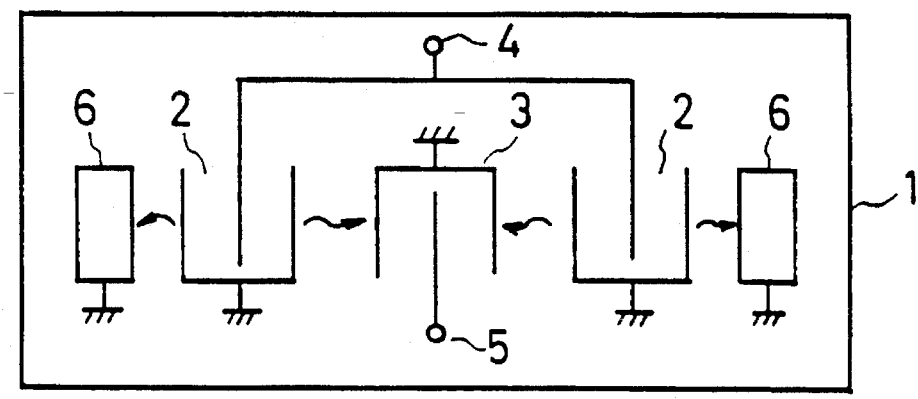
FIG. 3 is a block diagram of an exemplary surface acoustic wave device of the prior art.
Figure 4:
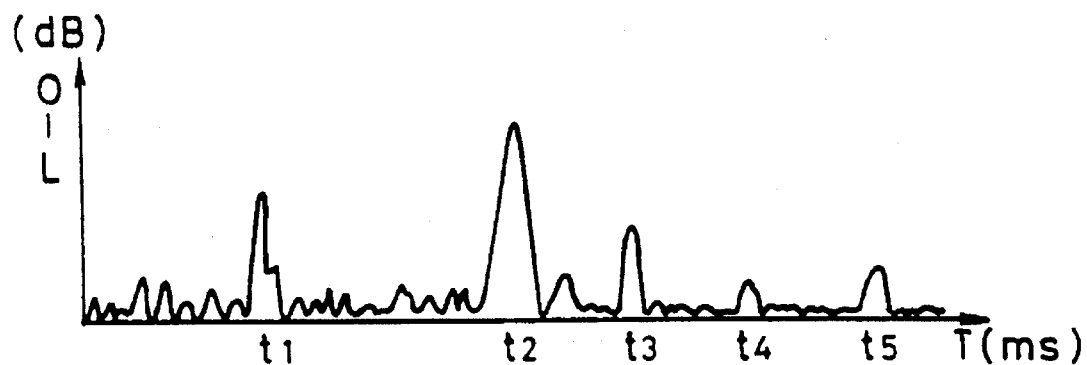
FIG. 4 is a diagram of signal transmission characteristics of the prior art surface acoustic wave device of FIG. 3.
Figure 5:
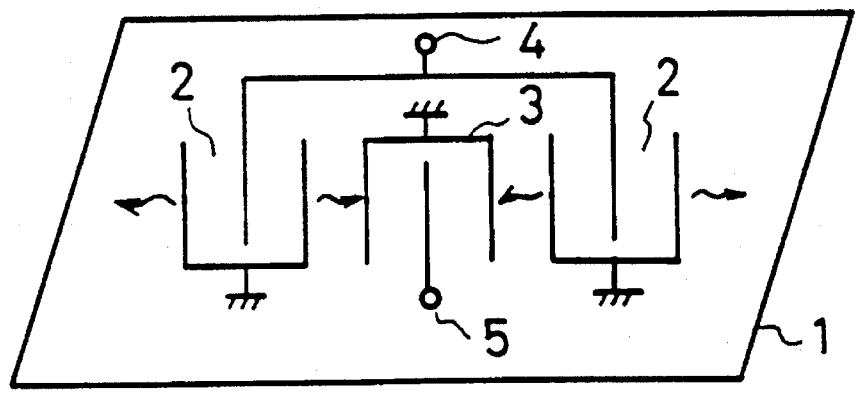
FIG. 5 is a block diagram of another exemplary surface acoustic wave device of the prior art.
Figure 6:
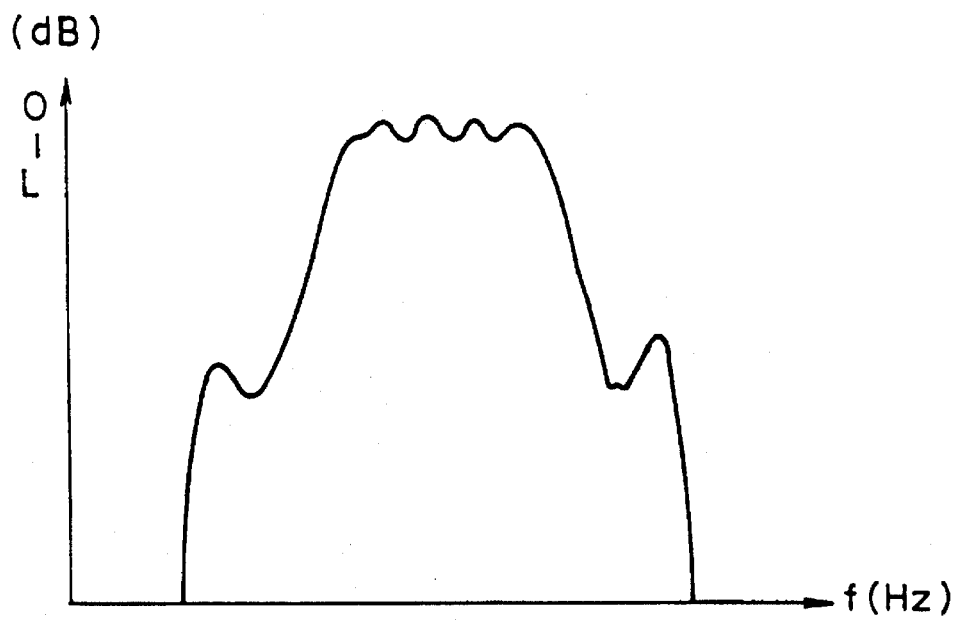
FIG. 6 is an enlarged view of a passband in the characteristic diagram of the surface acoustic wave device of FIG. 3.
Figure 7:
FIG. 7 is an enlarged view of a passband in the characteristic diagram of the surface acoustic wave device of FIG. 5.

In this embodiment, the metal patterns 6a and 6b adjacent to the input transducers are shaped like a trapezoid compared with the oblong metal patterns 6 of the prior art shown in FIG. 3. In other words, the above-described metal patterns 6a and 6b are shaped like a trapezoid having a perpendicular side 6x that the surface acoustic wave propagating from the transducer reaches as a first side and an inclined side 6y that the surface acoustic wave reaches after it propagates through the location of the metal pattern, these sides being located at the boundary between the metal pattern and the substrate 1. The angle θ of the inclined side 6y is set at a range of more than 5° and less than 85°, or more than −85° and less than −5° with respect to the propagation direction of the surface acoustic wave.

Figure 8:
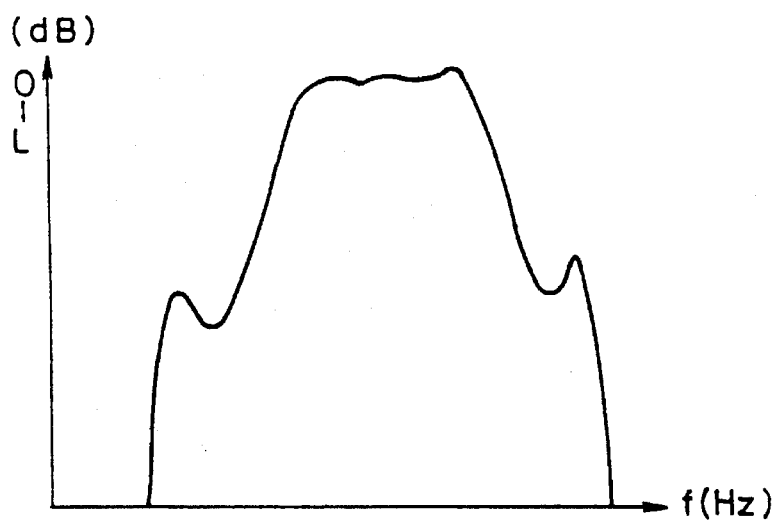
FIG. 8 is an enlarged view of a passband in the characteristic diagram of the surface acoustic wave device of FIG. 2(a)
Figure 32:
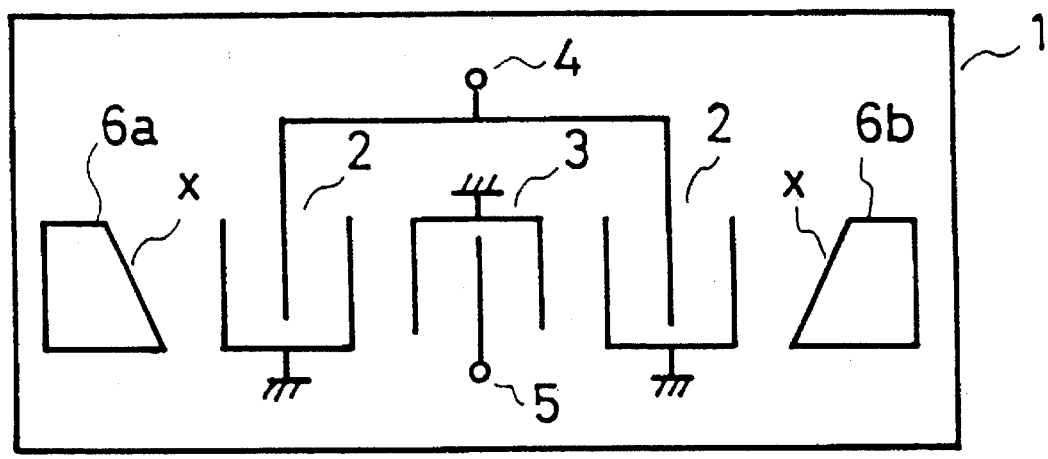
FIG. 32 is a block diagram of another surface acoustic wave device according to Embodiment 1 of the present invention.
Figure 33:
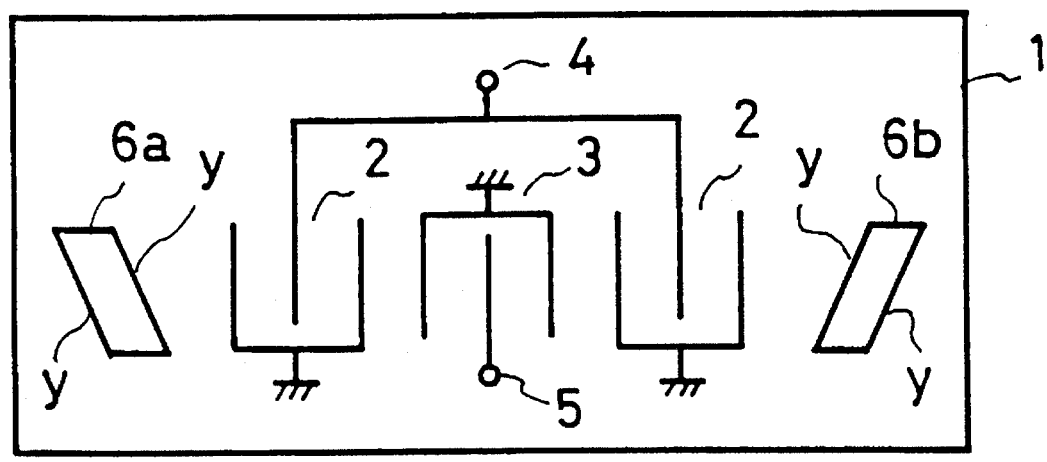
FIG. 33 is a diagram of the configuration of another surface acoustic wave device according to Embodiment 1 of the present invention.

Owing to the above-described structure, in the surface acoustic wave device of this embodiment shown in FIG. 1 and FIG. 2(a), the surface acoustic wave leaked from the input transducers 2 passes through the trapezoidal metal patterns a and 6b and is reflected and refracted by mismatching of impedance at end portions of the metal patterns 6a and 6b. Thereby, the surface acoustic wave which returns to the input transducers 2 is slight, and hence, the effect of reflection at end portions of the substrate is extremely small. In this instance, the sides x of the metal patterns 6a and 6b located outside the input transducers 2 may be inclined as shown in FIG. 32, or two sides y of the metal patterns 6a and 6b may be inclined as shown in FIG. 33. In both cases, the same effect as described above can be obtained. In FIG. 1, reflection which takes place at the small non-metal containing spaces between the input transducers 2 and the metal patterns 6a and 6b is not taken into consideration. However, if it is taken into consideration, the spaces are set at half a wavelength ($\lambda_0/2$) as shown in FIG. 2(a) and FIG. 2(b). Also shown in FIG. 2(b) and labeled as such in each case are representations of (1) a wave which is leaked toward the outside of the structure, (2) a wave which is reflected by the end portions of the input transducers 2, and (3) a wave which is reflected by the metal patterns 6b. Thereby, as shown in FIG. 2(b), the wave reflected by the metal patterns 6a and 6b becomes different from the wave reflected by end portions of the input transducers 2 by a phase of $\pi$. Therefore, the waves are weakened by each other and the effect of reflections from end portions can be further reduced. With the structure shown in FIG. 2(a), frequency characteristics having few ripples as shown in FIG. 8 can be obtained. FIG. 8 shows frequency response characteristic in the pass band for the SAW filter of the first embodiment of the present invention. This is shown in terms of loss as a function of frequency in the pass band. As shown on the vertical axis, loss decreases toward zero in the upward direction. As noted, ripples in the frequency characteristics have been substantially decreased.

Embodiment 2

Figure 9:
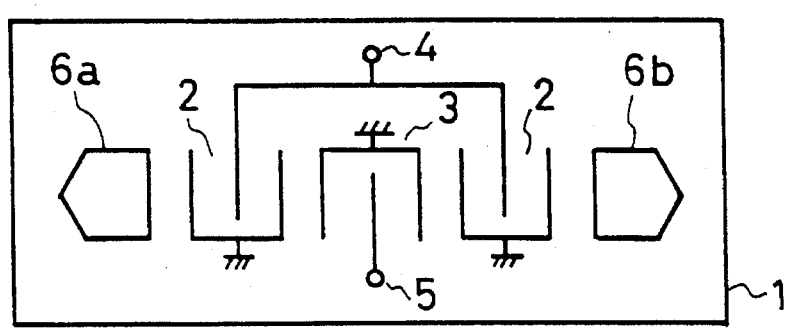
FIG. 9 is a block diagram of a surface acoustic wave device according to Embodiment 2 of the present invention.
Figure 10:
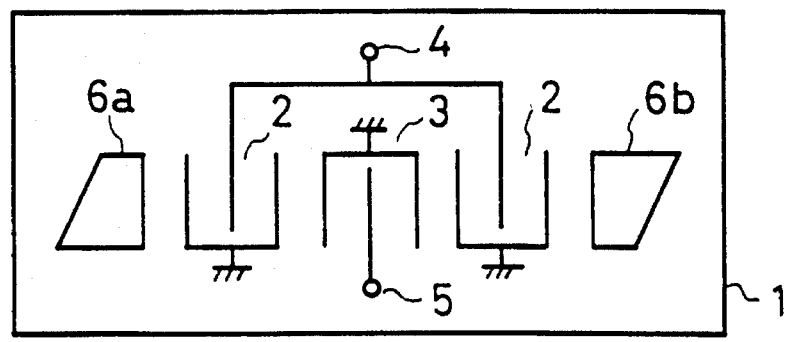
FIG. 10 is a block diagram of another surface acoustic wave device according to Embodiment 2 of the present invention.
Figure 11:
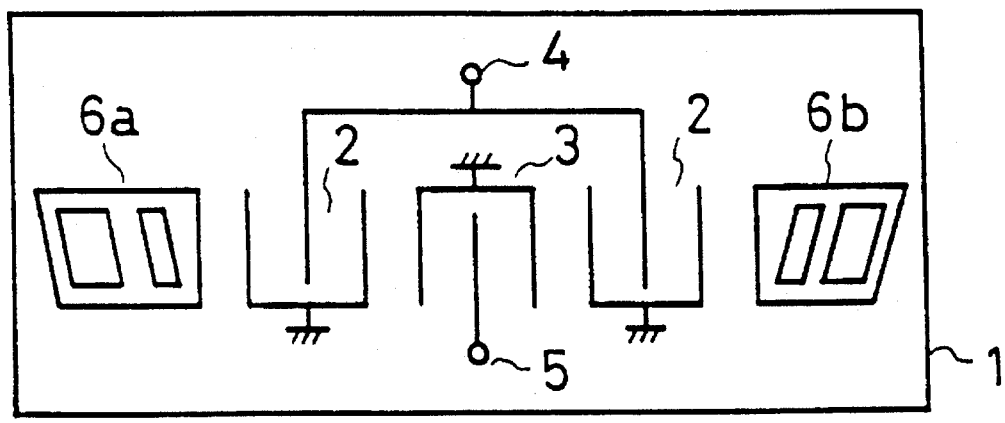
FIG. 11 is a block diagram of another surface acoustic wave device according to Embodiment 2 of the present invention.
Figure 12:
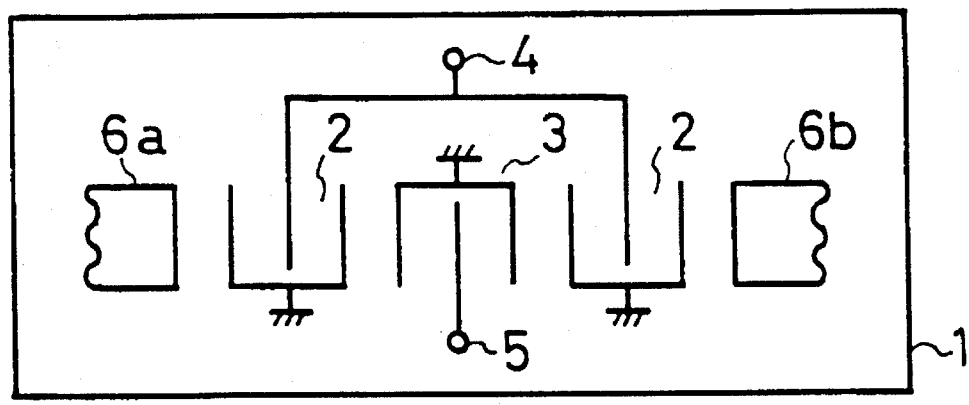
FIG. 12 is a block diagram of another surface acoustic wave device according to Embodiment 2 of the present invention.

In the above-described embodiment, the metal patterns 6a and 6b located outside the transducers are trapezoidal. They may be pentagonal as shown in FIG. 9, trapezoidal facing opposite directions as shown in FIG. 10, or polygonal with a part of the metal patterns 6a and 6b uncovered with metal as shown in FIG. 11. As shown in FIG. 12, the metal patterns 6a and 6b may have a waved portion. The embodiment having these patterns produces the same effect as Embodiment 1.

Figure 13:
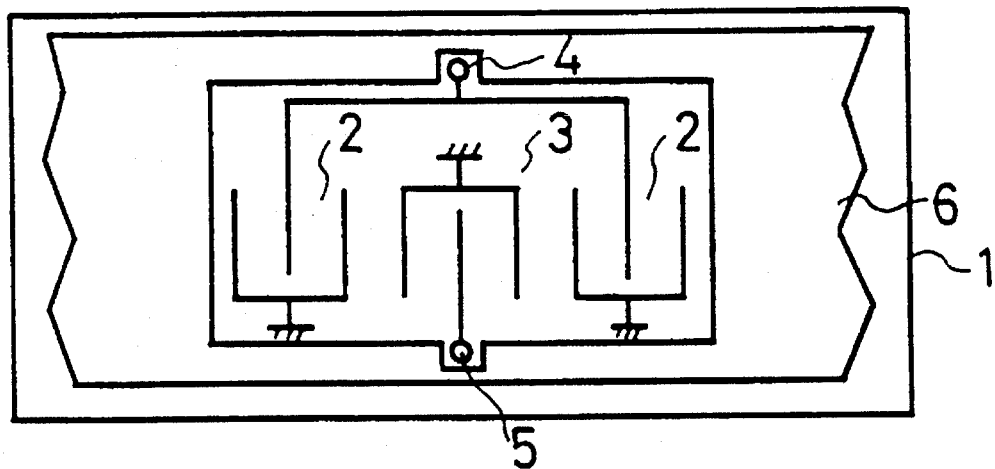
FIG. 13 is a block diagram of another surface acoustic wave device according to Embodiment 2 of the present invention.

In FIGS. 9–12, the above-described metal patterns 6a and 6b are respectively provided between the input transducers 2 and end portions of the substrate 1 in Embodiment 1, but may also be provided to cover the input transducers 2, the output transducer 3, the input terminal 4 and the output terminal 5 as shown in FIG. 13. in which metal pattern 6 on substrate 1 covers the entire area as shown. In this case, the same effect as in Embodiment 1 can be obtained.

Figure 14:
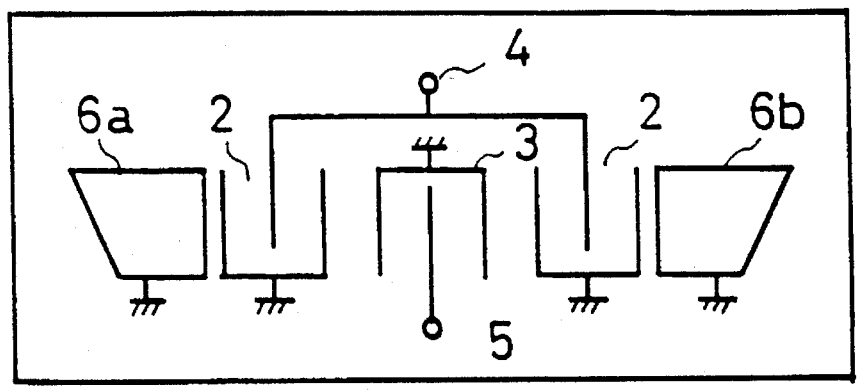
FIG. 14 is a block diagram of another surface acoustic wave device according to Embodiment 2 of the present invention.
Figure 15:
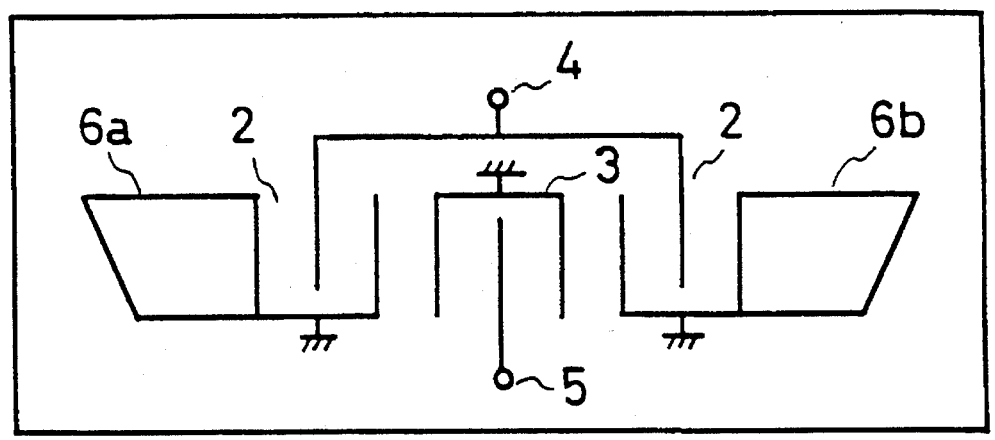
FIG. 15 is a block diagram of another surface acoustic wave device according to Embodiment 2 of the present invention.

In Embodiment 1, the metal patterns 6a and 6b function as floating electrodes, but as shown in FIG. 14, both may be grounded. Also, as shown in FIG. 15, the transducers and the metal patterns 6a and 6b adjacent thereto may be combined together.

Figure 16:
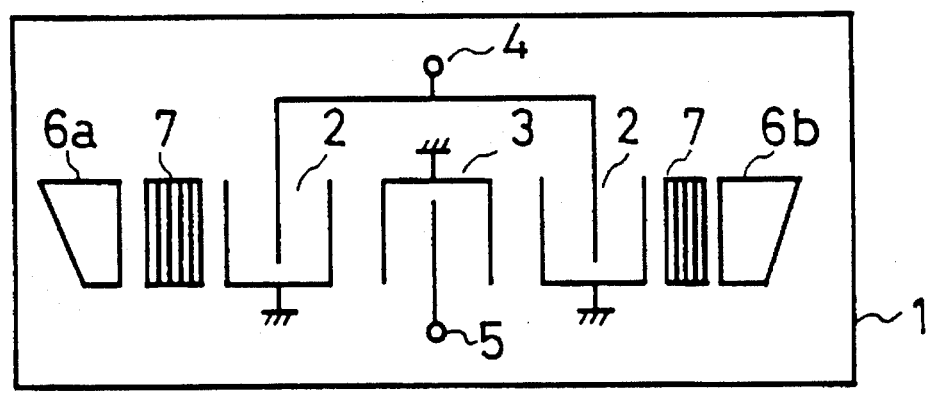
FIG. 16 is a block diagram of another surface acoustic wave device according to Embodiment 2 of the present invention.

In Embodiment 1, the metal patterns 6a and 6b are located outside the transducers, but, as shown in FIG. 16, they may be located outside the grating reflectors 7. In this case, the same effect can be obtained. In FIGS. 14–16, the same reference numerals are used to refer to like elements which are described in connection with other drawing figures and a further description of these like elements has therefore been omitted here.-.

In each of the above embodiments, a surface acoustic wave device constructed by two input IDTs and one output IDT has been described, but each of the embodiments can be applied to a surface acoustic wave device which is constructed by a plurality of input IDTs and a plurality of output IDTs. In this case, the same effect can also be obtained.

Embodiment 3

Preferred embodiments of the second invention will be described hereunder with reference to the accompanying drawings. FIG. 17, FIG. 18, FIG. 19 and FIG. 20 are plan views of different surface acoustic wave devices. In FIG, 17, FIG. 18, FIG. 19 and FIG. 20, the same components as those of FIG. 27 are given the same reference labels and, therefore, their descriptions are omitted.

Figure 17:
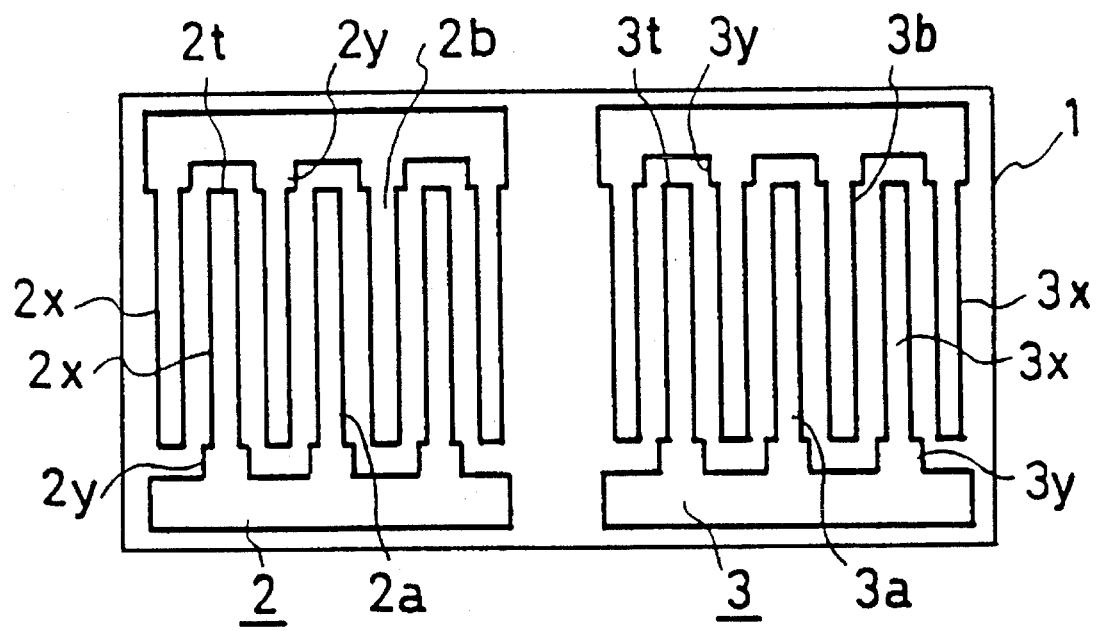
FIG. 17 is a plan view of a surface acoustic wave device according to Embodiment 3 of the present invention.

With reference to FIG. 17, a surface acoustic wave device will be described hereunder. The comb-like electrode fingers 2a and 2b of the input IDT 2 mesh with each other and the comb-like electrode fingers 3a and 3b of the output IDT 3 also mesh with each other. Main portions 2x and 3x of the electrode fingers which mesh with each other (2a and 2b, 3a and 3b) and root portions 2y and 3y (whose lengths are equal to the space between the ends 2t and 3t of the electrode fingers and the other electrodes 2 and 3, respectively) of the electrode fingers are considered separately.

Figure 27:
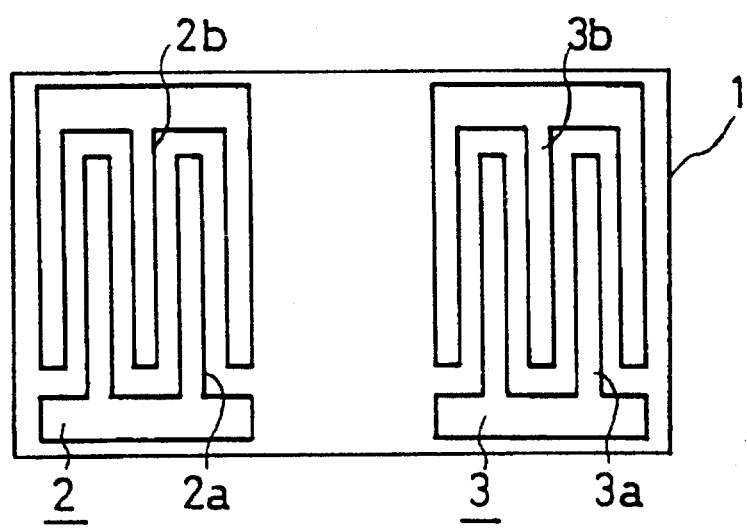
FIG. 27 is a plan view of a prior art surface acoustic wave device.

When patterning of such a surface acoustic wave device as shown in FIG. 27 is performed by the electron beam lithography, the root portions of the electrode fingers may become thinner than the main portions of the electrode fingers where electrode finger patterns mesh each other, or may partially disappear due to the proximity effect of electrons. To eliminate this problem, the root portions of the electrode fingers are made wider in advance so that they are prevented from partially disappearing even if they thin due to the proximity effect, thereby preventing improper patterning.

Figure 18:
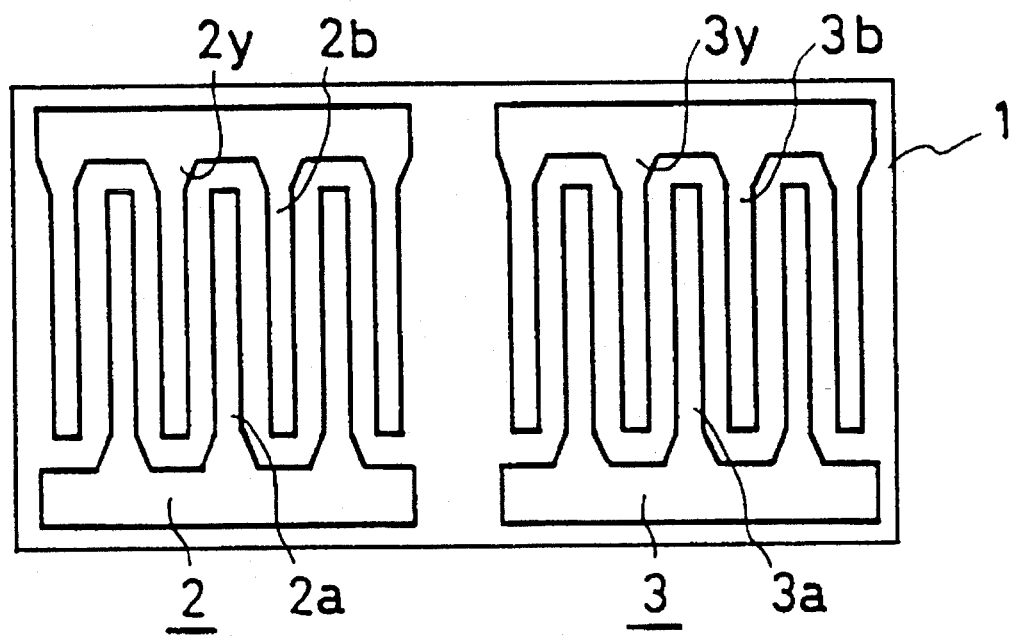
FIG. 18 is a plan view of another surface acoustic wave device according to Embodiment 3 of the present invention.
Figure 19:
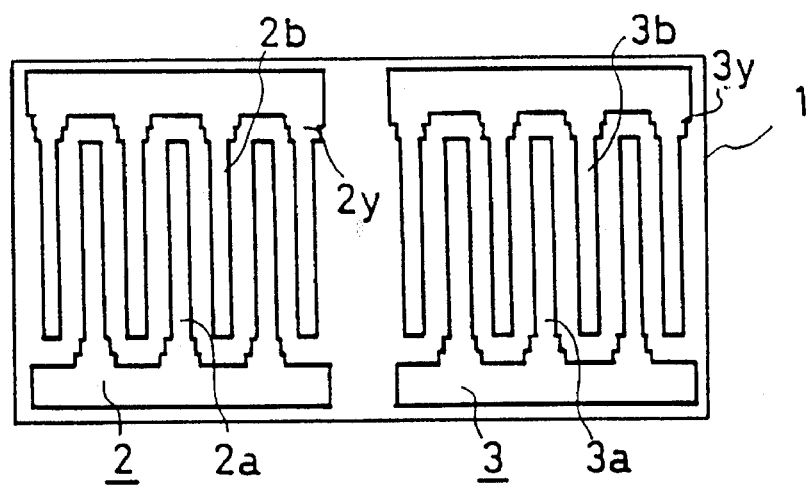
FIG. 19 is a plan view of another surface acoustic wave device according to Embodiment 3 of the present invention.
Figure 20:
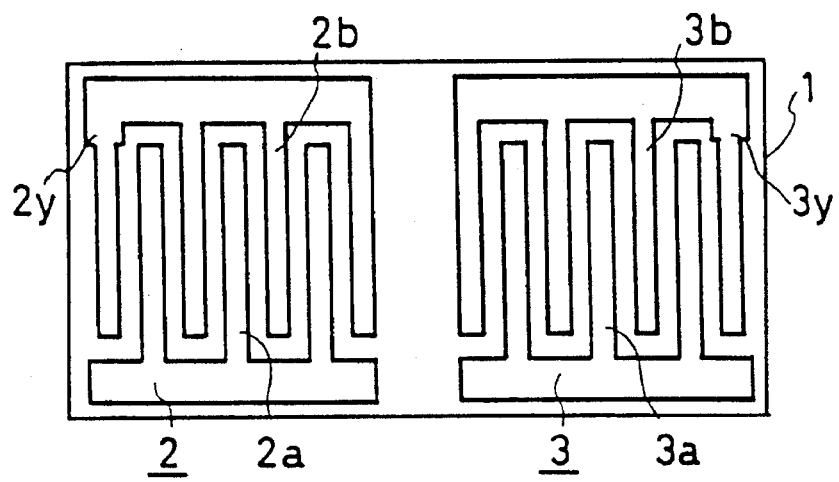
FIG. 20 is a plan view of another surface acoustic wave device according to Embodiment 3 of the present invention.

FIG. 18 and FIG. 19 show other surface acoustic wave devices which have root portions 2y and 3y of the electrode fingers wider than the main portions and shapes other than that of FIG. 17. The surface acoustic wave devices of FIG. 18 and FIG. 19 can produce the same effect as the above-described embodiment. FIG. 20 shows another surface acoustic wave device wherein a root portion of a part of the electrode fingers 2y, 3y of FIG. 17 is made wider. This surface acoustic wave device can also produce the same effect as the above-described embodiment. This is because the line width of the root portions of the electrode fingers having few line patterns in the proximity thereof easily becomes smaller in the electron beam lithography. In the case of the surface acoustic wave device shown in FIG. 17, the root portions which are apt to thin are on the left end of the input IDT 2 and the right end of the output IDT 3.

Embodiment 4

Figure 21:
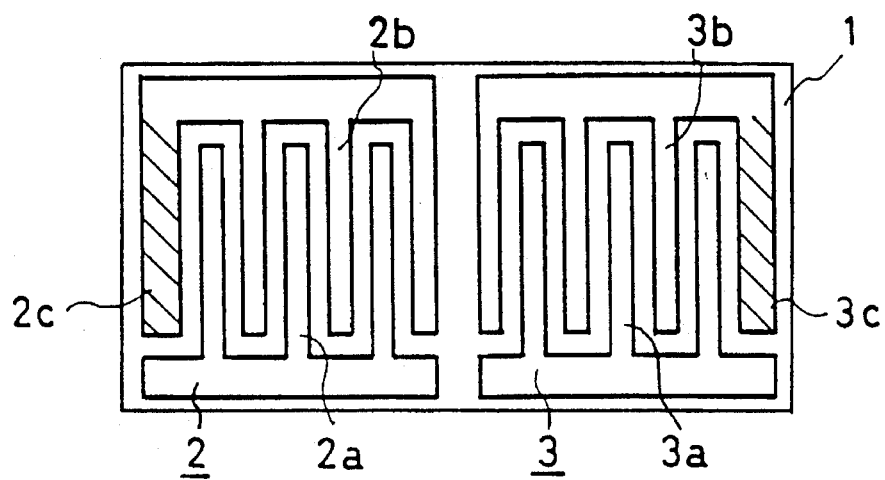
FIG. 21 is a plan view of a surface acoustic wave device according to Embodiment 4 of the present invention.
Figure 22:
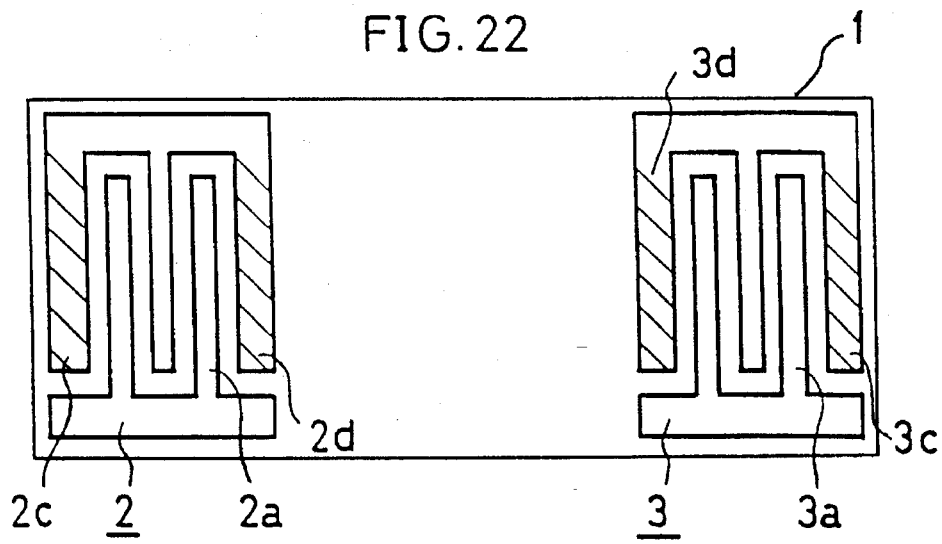
FIG. 22 is a plan view of another surface acoustic wave device according to Embodiment 4 of the present invention.

FIG. 21 and FIG. 22 are plan views of surface acoustic wave devices of the present invention. In FIG. 21 and FIG. 22, the same components as those of FIG. 27 are given the same reference labels, and accordingly, their descriptions are omitted.

When patterning of such a surface acoustic wave device as shown in FIG. 27 is performed by the electron beam lithography, electrode fingers having a much wider space between patterns may become thinner than other electrode fingers due to the proximity effect of electrons. To eliminate this problem, electrode fingers having a much wider space between patterns are made wider in advance so that this phenomenon caused by the proximity effect can be prevented.

In FIG. 21, electrode fingers having a much wider space between patterns are 2c and 3c of the uppermost end patterns of the surface acoustic wave device, which have few patterns in the proximity thereof. In FIG. 22, electrode fingers having a much wider space between patterns are 2c and 3c of the uppermost end patterns of the surface acoustic wave device and 2d and 3d facing the space between the input IDT and the output IDT.

As an example of the above-described embodiment, a surface acoustic wave device constructed only by the input IDT and the output IDT has been described, but the embodiment can be applied to a surface acoustic wave device provided with, for example, grating reflectors in addition to these IDTs, and the same effect can be obtained.

Embodiment 5

Figure 23:
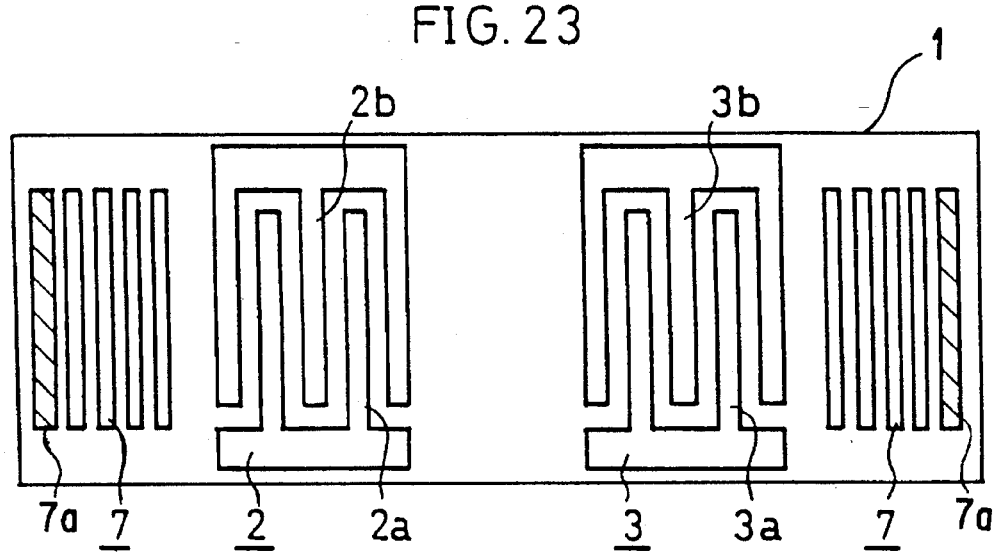
FIG. 23 is a plan view of a surface acoustic wave device according to Embodiment 5 of the present invention.
Figure 24:
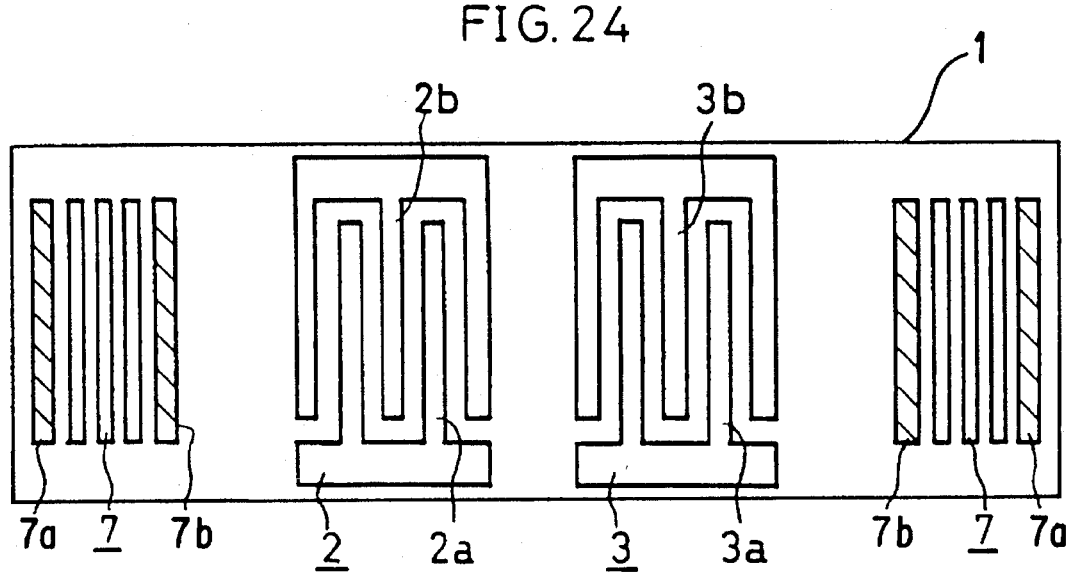
FIG. 24 is a plan view of another surface acoustic wave device according to Embodiment 5 of the present invention.

FIG. 23 and FIG. 24 are plan views of surface acoustic wave devices of the present invention. In FIG. 23 and FIG. 24, the same components as those of FIG. 28 are given the same reference labels, and accordingly, their descriptions are omitted.

Figure 28:
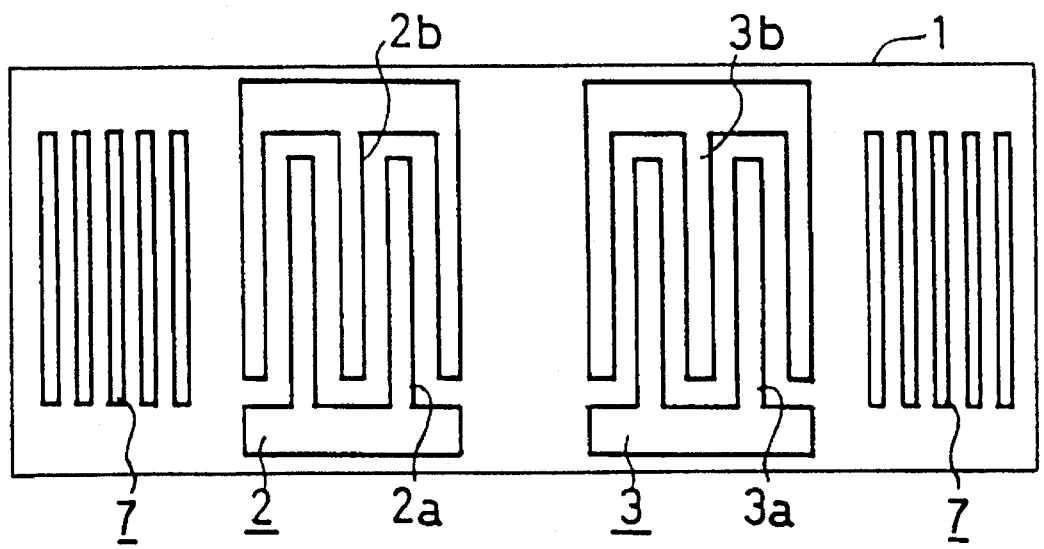
FIG. 28 is a plan view of another prior art surface acoustic wave device.

When patterning of such a surface acoustic wave device as shown in FIG. 28 is performed by the electron beam lithography, the strip line of the grating reflector having a much wider space between patterns may become thinner than other strip lines due to the proximity effect of electrons. To eliminate this problem, the strip line having a much wider space between patterns is made wider in advance so that this phenomenon caused by the proximity effect can be prevented.

In FIG. 23, the strip line having a much wider space between patterns from among the strip lines constituting the grating reflector 7 is 7a of the uppermost end pattern of the surface acoustic wave device, which has few patterns in the proximity thereof. In FIG. 24, in which the same reference numerals are used to designate like elements as used in FIG. 23, the strip lines having a much wider space between patterns are 7a of the uppermost end pattern of the surface acoustic wave device and 7b facing the IDT.

As an example of the above-described embodiment, a surface acoustic wave device constructed only by input and output IDTs and grating reflectors has been described, but the embodiment can be applied to a surface acoustic wave device provided with, for example, a multi-strip coupler in addition to these IDTs and grating reflectors, and the same effect can be obtained.

Embodiment 6

Figure 25:
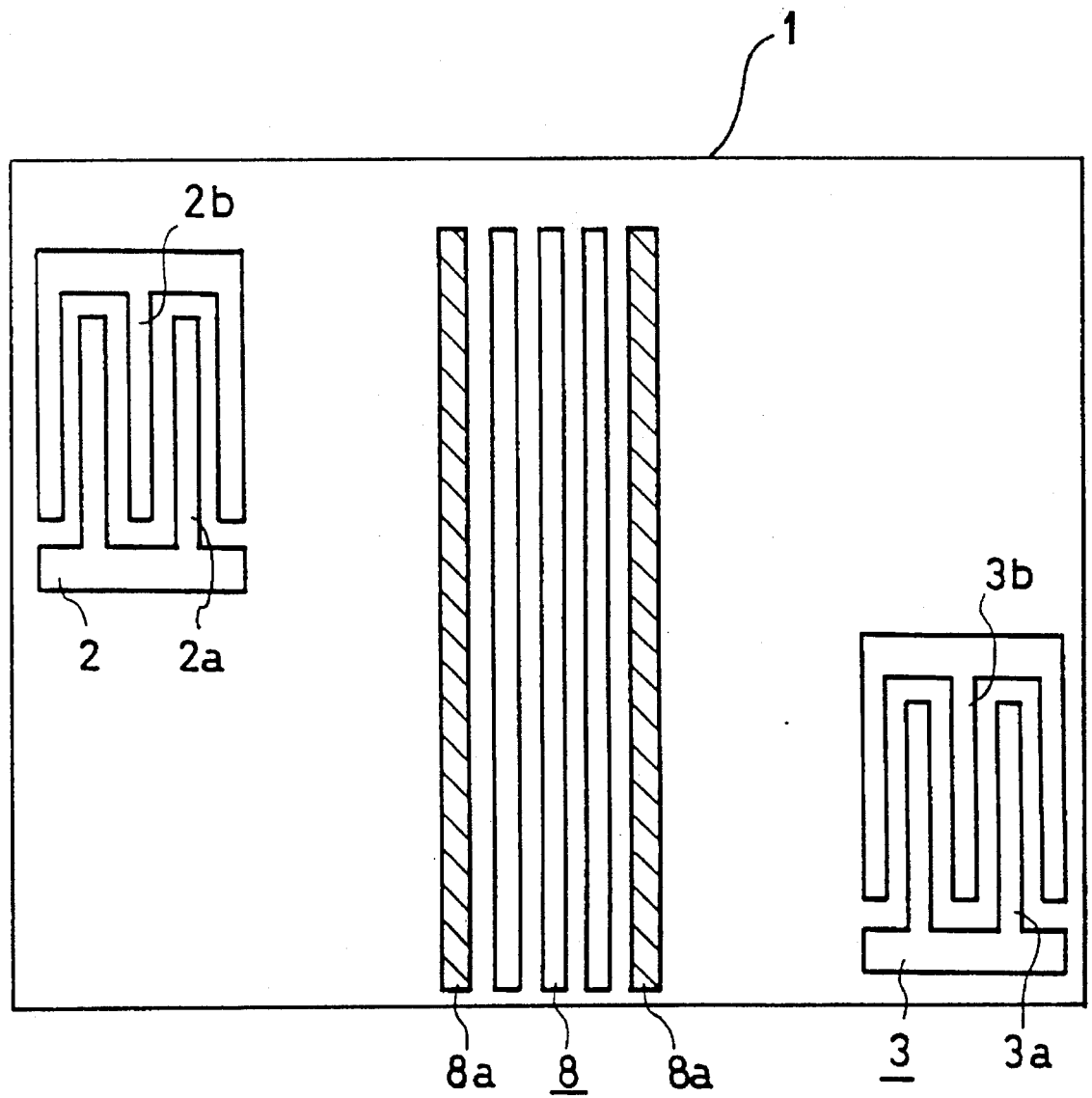
FIG. 25 is a plan view of a surface acoustic wave device according to Embodiment 6 of the present invention.

FIG. 25 is a plan view of a surface acoustic wave device of the present invention. In FIG. 25, the same components as those of FIG. 29 are given the same reference labels, and accordingly, their descriptions are omitted.

Figure 29:
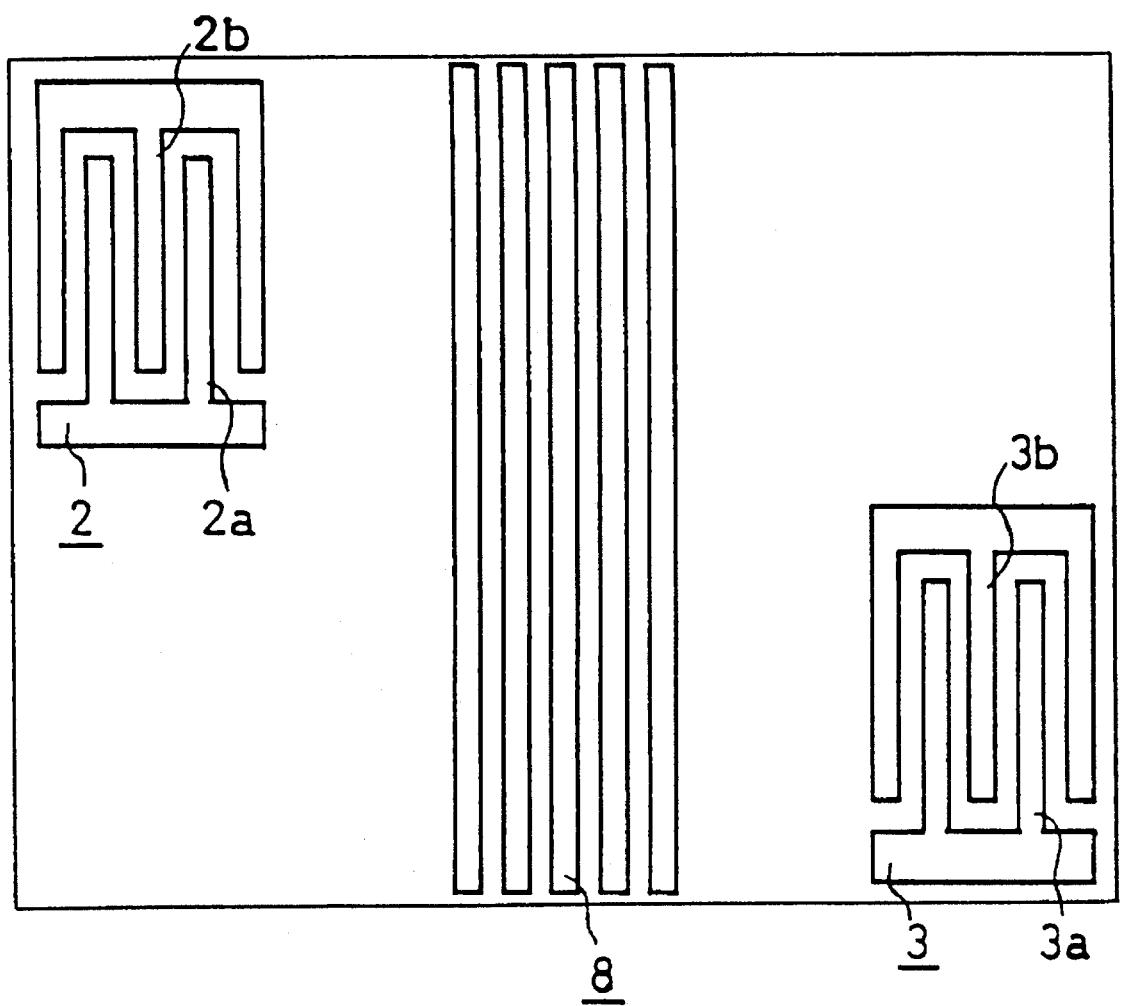
FIG. 29 is a plan view of another prior art surface acoustic wave device.
Figure 30:
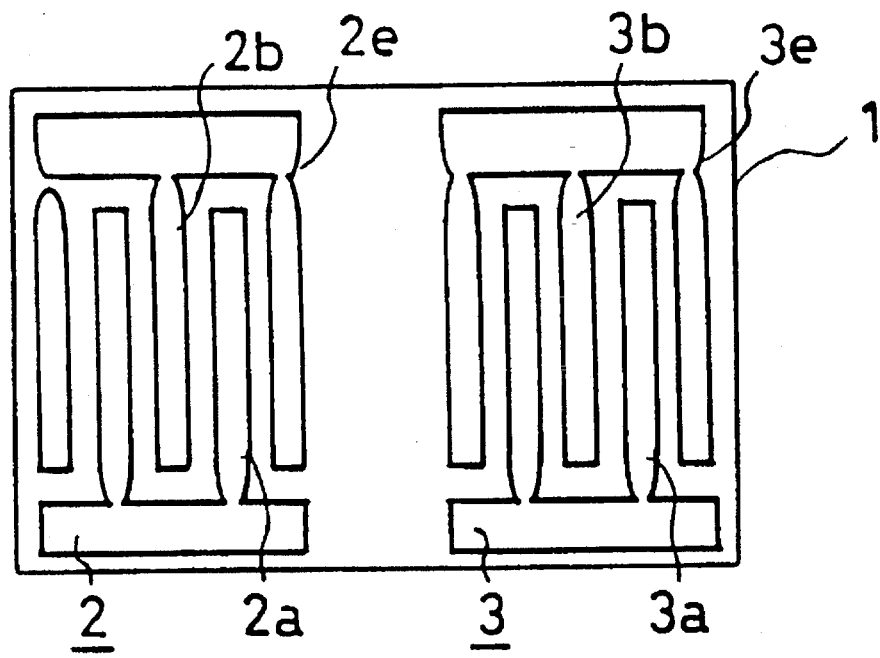
FIG. 30 is a plan view illustrating a problem which occurs when an electron beam is irradiated onto a prior art surface acoustic wave device.
Figure 31:
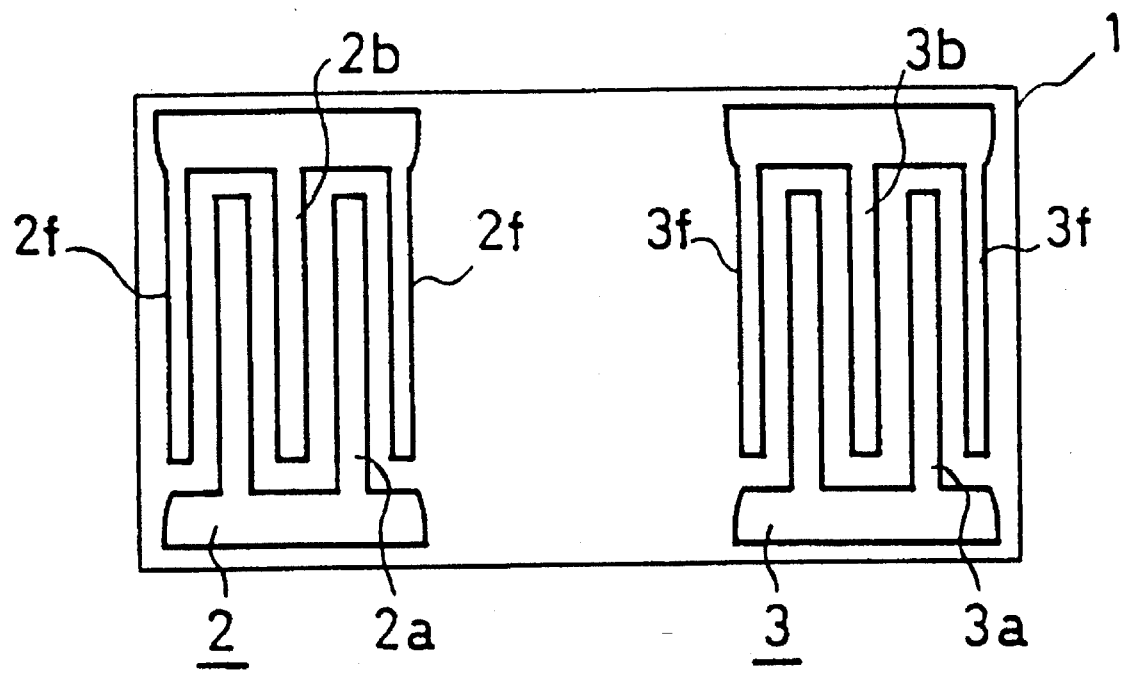
FIG. 31 is a plan view illustrating a problem which occurs when an electron beam is irradiated onto a prior art surface acoustic wave device.

When patterning of such a surface acoustic wave device as shown in FIG. 29 is performed by the electron beam lithography, the strip line of the multi-strip coupler having a much wider space between patterns may become thinner than other strip lines due to the proximity effect of electrons. To eliminate this problem, the strip line having a much wider space between patterns is made wider in advance so that this phenomenon caused by the proximity effect can be prevented.

In FIG. 25, the strip line having a much wider space between patterns is 8a of the uppermost end patterns of the multi-strip coupler, which has few patterns in the proximity thereof.

Embodiment 7

Figure 26:
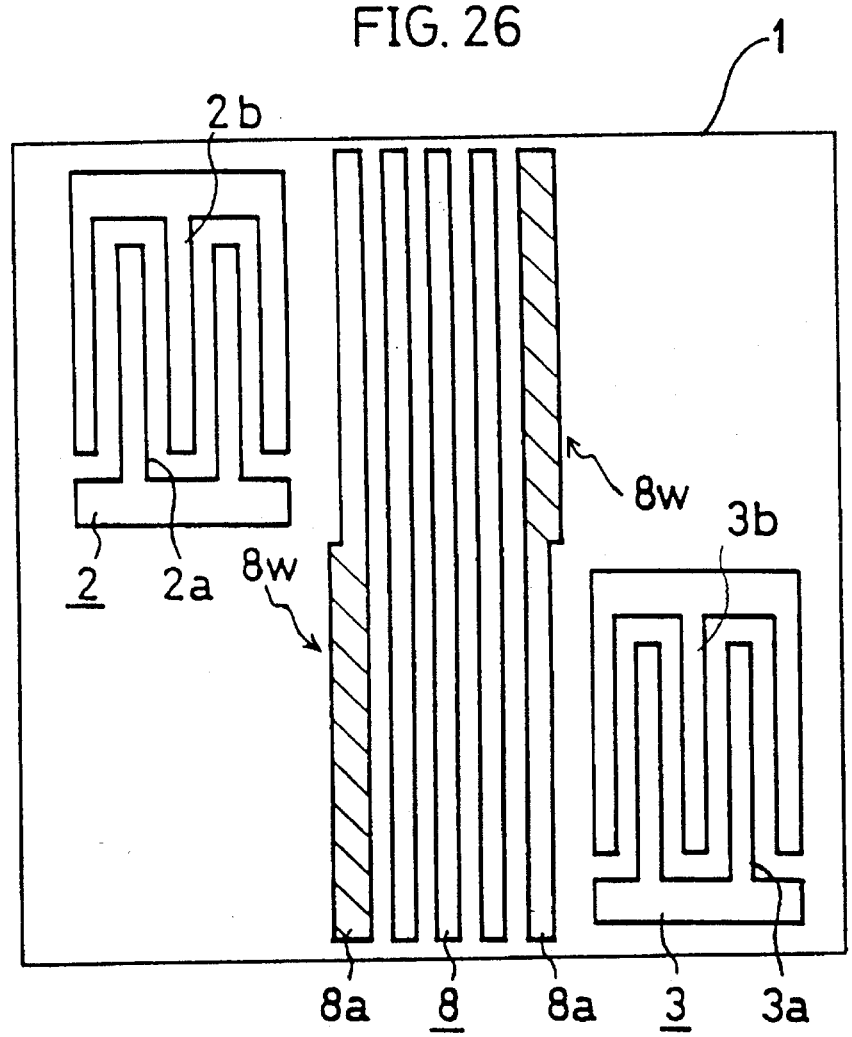
FIG. 26 is a plan view of a surface acoustic wave device according to Embodiment 7 of the present invention.

FIG. 26 is a plan view of a surface acoustic wave device of the present invention. In FIG. 26, the same components as those of FIG. 29 are given the same reference labels, and accordingly, their descriptions are omitted.

When patterning of such a surface acoustic wave device as shown in FIG. 29 is performed by the electron beam lithography, a portion of the strip line of the multi-strip coupler having a much wider space between patterns may become thinner than other portions due to the proximity effect of electrons. To eliminate this problem, the portion of the strip line having a much wider space between patterns is made wider in advance so that this phenomenon caused by the proximity effect can be prevented.

In FIG. 26, the portion of the strip line of the multi-strip coupler having a much wider space between patterns is 8w of the strip line 8a at both ends of the multi-strip coupler. 8w is the portion which has no adjacent patterns constituting input and output transducers.

In each of the above embodiments, the patterning of a surface acoustic wave device has been described, but each of the above embodiments can be applied to the patterning of a photomask used in the surface acoustic wave device as described in the foregoing. In this case, the same effect as the above-described embodiments can be obtained. The space between patterns is preset in the stage of design layout.

In each of the above embodiments, a surface acoustic wave device constructed by one input IDT and one output IDT has been described, but each of the embodiments can be applied to a surface acoustic wave device which is constructed by a plurality of input IDTs and a plurality of output IDTs. In this case, the same effect can also be obtained.

As described on the foregoing pages, according to the first invention, since the metal patterns located outside the transducers are formed such that the surface acoustic wave is scattered, the surface acoustic wave device can be produced with ease at a low cost and does not deteriorate frequency characteristics even if it is made small in size.

As described on the foregoing pages, according to the second invention, improper patterning at the time of electron beam exposure can be prevented by making root portions of the electrode fingers wider than other portions without changing the conventional production process, whereby stable production of a surface acoustic wave device is possible.

Moreover, the electrode fingers and the strip line of the grating reflector and the multi-strip coupler having a much wider space between patterns are made wider than other electrode fingers and other strip lines, respectively, to prevent the pattern width from becoming thinner at the time of electron beam exposure, without changing the conventional production process, whereby stable production of a surface acoustic wave device is possible.

Furthermore, a portion of the strip line of the multi-strip coupler having a much wider space between patterns is made wider than other portions of the strip line to prevent the strip line from partially thinning at the time of electron beam exposure, without changing the conventional production process, whereby stable production of a surface acoustic wave device is possible.

What is claimed is:

1. A surface acoustic wave device comprising a substrate for propagating a surface acoustic wave, and having input and output transducers disposed on the surface of said substrate, each said input and output transducer having a pair of opposite electrodes, each opposite electrode having a plurality of electrode fingers, each pair of opposite electrodes having the plurality of electrode fingers extending toward and meshing with each other, characterized in that all of said electrode fingers have root portions which are wider than other portions of said electrode fingers to prevent improper patterning of such root portions.

* * * * *

UNITED STATES PATENT AND TRADEMARK OFFICE
CERTIFICATE OF CORRECTION

PATENT NO. : 5,485,051
DATED : January 16, 1996
INVENTOR(S) : Yoshiko Tera et al.

It is certified that error appears in the above-indentified patent and that said Letters Patent is hereby corrected as shown below:

Col. 1, line 53, "liven" should be -- given --; Col. 4, line 63, delete "a"; same line, "diagram" should be -- diagrams --; Col. 6, line 59, "a" should be -- 6a --.

Signed and Sealed this

Second Day of July, 1996

Attest:

BRUCE LEHMAN

Attesting Officer

Commissioner of Patents and Trademarks